(12) United States Patent
Bishop

(10) Patent No.: US 8,719,322 B2
(45) Date of Patent: May 6, 2014

(54) FLOATING POINT FORMAT CONVERTER

(75) Inventor: David W. Bishop, Hilton, NY (US)

(73) Assignee: Kodak Alaris Inc., Rochester, NY (US)

( * ) Notice: Subject to any disclaimer, the term of this patent is extended or adjusted under 35 U.S.C. 154(b) by 518 days.

(21) Appl. No.: 13/080,883

(22) Filed: Apr. 6, 2011

(65) Prior Publication Data

US 2012/0259904 A1 Oct. 11, 2012

(51) Int. Cl.
*G06F 7/00* (2006.01)
(52) U.S. Cl.
USPC .......................................................... 708/204
(58) Field of Classification Search
CPC ...... H03M 7/24; G06F 9/30025; G06F 7/572; G06F 7/4876; G06F 7/491
USPC ........................................................ 708/204
See application file for complete search history.

(56) References Cited

U.S. PATENT DOCUMENTS

| 7,921,144 B2* | 4/2011 | Hack .............................. 708/204 |
| 8,065,669 B2* | 11/2011 | Donovan et al. ............. 708/204 |
| 2012/0047190 A1* | 2/2012 | Lundvall et al. .............. 708/204 |

OTHER PUBLICATIONS

IEEE Standard for Floating-Point Arithmetic 754-2008.
Cowlishaw, "Decimal Floating-Point: Algorism for Computers," Proc. 16th IEEE Symposium on Computer Arithmetic, (2003).
Intel Corporation, "Intel Decimal Floating-Point Math Library," http://software.intel.com/en-us/articles/intel-decimal-floating-point-math-library/.
Bishop, "Floating point package user's guide," http://www.vhdl.org/fphdl/Float_ug.pdf.

* cited by examiner

*Primary Examiner* — Tan V. Mai
(74) *Attorney, Agent, or Firm* — Hogan Lovells US LLP

(57) ABSTRACT

A computer program product for converting from a first floating point format to a second floating point format, each floating point format having an associated base value and being represented by a significand value and a exponent value, comprising an executable algorithm to perform the steps of: determining the second exponent value by multiplying the first exponent value by a predefined constant and taking the integer portion of the result, the predefined constant being substantially equivalent to the logarithm of the first base value divided by the logarithm of the second base value; determining a bias value substantially equivalent to the second base value raised to the second exponent value divided by the first base value raised to the first exponent value; and determining the second significand value by multiplying the first significand value by the bias value.

25 Claims, 5 Drawing Sheets

FLOATING POINT FORMAT CONVERTER

FIELD OF THE INVENTION

This invention pertains to the field of the field of floating point format conversion, and more particularly to method for converting from a first floating point number format having a first base value to a second floating point number format having a second base value.

BACKGROUND OF THE INVENTION

Floating point number representations are commonly used to represent real numbers in digital computing applications. A floating point number has an associated base value, and is described by three integers: a sign value, a significand, and an exponent. The sign value, the significand and the exponent are encoded using binary representations and stored in memory in a defined format, such as the formats defined in the well-known IEEE Standard for Floating-Point Arithmetic 754-2008. In various references, the significand is sometimes referred to as the "mantissa," the "fraction," or the "payload."

Given a number represented in a floating point format, the value of a real number result R is obtained using the following equation:

$$R = (-1)^S \times M \times B^E \quad (1)$$

where B is the base (typically 2 or 10), S is the sign bit and has a value of zero for positive numbers or one for negative numbers, E is the exponent and M is the significand. For example, if the base is B=10, the sign is S=1 (indicating negative), the significand is M=12345, the exponent is E=−3, and, then the value of the resulting real number is R=−12.345.

For many years most digital computing systems encoded floating point numbers using a binary floating point format having a base of B=2 (as defined in IEEE 754-1985). This format is still in predominant use in most desktop computers. The new 2008 version of this standard (IEEE 754-2008) introduces decimal floating point formats that are based on a base of B=10.

Tables 1 and 2 give the number of significant figures in the significand, together with the range of supported exponent values ($E_{min} \leq E \leq E_{max}$) for the binary and decimal floating point formats, respectively, defined in IEEE 754-2008.

TABLE 1

Standard binary floating point formats (B = 2).

|  | binary16 | binary32 | binary64 | binary128 |
|---|---|---|---|---|
| significant digits | 11 | 24 | 53 | 113 |
| $E_{max}$ | +15 | +127 | +1023 | +16383 |
| $E_{min}$ | −14 | −126 | −1022 | −16382 |

TABLE 2

Standard decimal floating point formats (B = 10).

|  | decimal32 | decimal64 | decimal128 |
|---|---|---|---|
| significant digits | 7 | 16 | 34 |
| $E_{max}$ | +96 | +384 | +6144 |
| $E_{min}$ | −95 | −383 | −6143 |

As discussed in the article "Decimal Floating-Point: Algorism for Computers" (Proc. 16th IEEE Symposium on Computer Arithmetic, 2003) by Cowlishaw, decimal floating point formats have the advantage that a hand-calculated value will give the same result as a computer-calculated result. However, defining a new floating point format causes difficult compatibility issues with older floating point formats.

To convert from a first floating point format to a second floating point format, it is necessary to solve for a new significand and a new exponent that will give the equivalent real number. Mathematically, this corresponds to:

$$M_1 \times B_1^{E_1} = M_2 \times B_2^{E_2} \quad (2)$$

where the subscript "1" corresponds to the first floating point format having a first base $B_1$, and the subscript "2" corresponds to the second floating point format having a second base $B_2$. Accordingly, $E_1$ is a first exponent and $M_1$ is a first significand for the first floating point format, and $E_2$ is a second exponent and $M_2$ is a second significand for the second floating point format.

One way to solve Eq. (2) for the second exponent $E_2$ and the second significand $M_2$ would be to let $M_2=M_1$ and solve the equation for $E_2$:

$$(E_2)_{real} = E_1 \times \log_{B_2} B_1 = E_1 \times \frac{\log B_1}{\log B_2} \quad (3)$$

where the logarithms in the log $B_1$/log $B_2$ term have an arbitrary base. However, both $E_1$ and $E_2$ must be stored as integers. Therefore in practice, $E_2$ is set to the integer portion of this quantity:

$$E_2 = \text{Int}[E_1 \times \log_{B_2} B_1] = \text{Int}\left[E_1 \times \frac{\log B_1}{\log B_2}\right] \quad (4)$$

where the operator Int[A] gives an integer portion of a real number A. Therefore, there will be a remainder portion that must be incorporated into the value of $M_2$. It can be shown that the new value of $M_2$ will be:

$$M_2 = M_1 \times B_2^{\text{Rem}[E_1 \times \log B_1/\log B_2, 1]} = M_1 \times \text{bias} \quad (5)$$

where Rem(A,B) is the remainder of (A/B), and $$\text{bias} = B_2^{\text{Rem}[E_1 \times \log B_1/\log B_2, 1]} \quad (6)$$

The value of $E_2$ determined using Eq. (4) can be calculated quickly in a digital computer using simple fixed point multiplication. Note that since $B_1$ and $B_2$ are constants, the value of log $B_1$/log $B_2$ can be stored as a predefined constant. The difficulty comes with the computation of $M_2$ using Eq. (5). In particular, the exponentiation operation of raising the base $B_2$ to a power is not conducive to simple fixed point arithmetic.

One way to compute the value of $M_2$ is to use a Taylor series expansion of the equation. However, this involves many calculations and has accuracy problems. Most practical implementations pre-compute the value of the bias in Eq. (6) for every possible different $E_1$ and store the results in a look-up table (LUT). However, this approach has the disadvantage that it requires a significant amount of memory. For example, if the first floating point format is the "binary64" format described in IEEE 754-2008, the LUT needs to store 2,046 different values, each of which requires 53 bits of storage memory, for a total of about 13.2 Kbytes of storage memory. Similarly, if the first floating point format is the "binary128" format described in IEEE 754-2008, the LUT needs to store 32,766 different values, each of which requires 113 bits of storage memory, for a total of about 452 Kbytes of storage memory. The appropriate LUT memory needs to be set aside for each pair of formats for which it is necessary to convert. The memory requirements become particularly significant when implementing this conversion in a hardware processor such as a Floating-point unit (FPU).

FIG. 1 shows a flowchart of a LUT-based method for converting from a binary floating point number 10 having an input base $B_1=2$, to a decimal floating point number 85 having an output base $B_2=10$. This basic approach is used in the publically available Decimal Floating-Point Math Library available from Intel Corporation of Santa Clara, Calif.

A decode floating point format step 15 is used to decode the binary floating point number 10 to extract a corresponding input sign value 20 ($S_1$), an input exponent 25 ($E_1$), and an input significand 30 ($M_1$). An output sign value 35 ($S_2$) is simply set to be equal to the input sign value 20 ($S_1$). According to Eq. (4), the input exponent 25, is multiplied by a predetermined constant 45 (log 2/log 10=$\log_{10}2$) using a multiplier 40 to compute an output exponent 50 ($E_2$). The multiplier 40 includes the application of an Int[.] operator so that the resulting output exponent 50 ($E_2$) is an integer. An apply bias LUT step 60 is used to determine a bias value 65 by addressing a bias LUT 55 with the input exponent 25 ($E_1$). The bias LUT 55 stores pre-computed bias values 65 for every possible value of the input exponent 25 ($E_1$) according to Eq. (6). (As mentioned above, if the binary floating point number 10 is in the "binary128" format described in IEEE 754-2008, the bias LUT 55 needs to store 32,766 different entries.) The input significand 30 ($M_1$) is multiplied by the bias value 65 using a multiplier 70 to compute the output significand 75 ($M_2$). The combination of the operations associated with the apply bias LUT step 60 and the multiplier 70 implement the computation given in Eq. (4).

A normalize floating point number step 80 is used to normalize the components of the output floating point number according to the requirements of the specific output floating point format. A floating point format specification, such as the aforementioned IEEE 754-2008 standard, requires that the significand satisfy certain conditions before it is encoded. (For example, if the output floating point number is a decimal floating point number, the encoding specification requires that the significand must be an integer.) The normalize floating point number step 80 modifies the output significand 75 ($M_2$) so that it can be correctly encoded. This is done by multiplying or dividing the output significand 75 ($M_2$) by powers of the output base $B_2$ until it satisfies the required conditions. In the case where the output floating point number is a decimal floating point number, the computed significand must be multiplied by powers of ten until all fractional digits are zero (or insignificant). The output exponent 50 ($E_2$) must be decremented or incremented by a corresponding value so that the real number value of the floating point number remains unchanged. The normalize floating point number step 80 may also include a rounding operation to round off any insignificant digits.

An encode floating point format step 85 encodes the output sign value 35 ($S_2$), the output exponent 50 ($E_2$) and the output significand 75 ($M_2$) according to the specification for desired decimal floating point format (e.g., according to the IEEE 754-2008 standard) to produce the decimal floating point number 85.

The method shown in FIG. 1 can easily be adapted to convert from a decimal floating point number to a corresponding binary floating number by making appropriate adjustments to the constant 45 and the values stored in the bias LUT 55. In this case, the value of the constant 45 will be log 10/log 2=$\log_2 10$, and the bias LUT 55 stores pre-computed bias values 65 for every possible value of the input exponent 25 ($E_1$) according to Eq. (6) using an input base of $B_1=10$ and an output base of $B_2=2$.

There remains a need for a method to convert between different floating point formats that is simultaneously accurate, computationally efficient and requires a minimal amount of memory.

SUMMARY OF THE INVENTION

The present invention represents a computer program product for converting a first floating point number represented in a first floating point format to an equivalent second floating point number in a second floating point format, the first floating point format having an associated first base value and being represented by a first significand value and a first exponent value, and the second floating point format having an associated second base value different from the first base value and being represented by a second significand value and a second exponent value, wherein either the first base value or the second base value is an integer power of two, and the other base value is not a power of two, comprising a non-transitory tangible computer readable storage medium storing an executable algorithm for causing a data processing system to perform the steps of:

determining the second exponent value for the second floating point number by multiplying the first exponent value by a predefined constant and taking the integer portion of the result, the predefined constant being substantially equivalent to the logarithm of the first base value divided by the logarithm of the second base value;

determining a bias value that is substantially equivalent to the first base value raised to the first exponent value divided by the second base value raised to the second exponent value, wherein the determination of the bias value includes:

determining an intermediate bias value by addressing a look-up table with the exponent value corresponding to the base that is not a power of two; and determining the bias value by applying a binary shift operation to the intermediate bias value, wherein a magnitude of the binary shift is determined responsive to the exponent value corresponding to the base that is a power of two; and determining the second significand value for the second floating point number by multiplying the first significand value by the bias value.

This invention has the advantage that it requires a smaller amount of memory for storing look-up tables relative to current implementations, and additionally produces results that are more accurate.

It has the additional advantage that it is less costly to implement in a hardware floating-point unit due to requiring a reduced number of logic gates.

DETAILED DESCRIPTION OF THE INVENTION

In the following description, some embodiments of the present invention will be described in terms that would ordinarily be implemented as software programs. Those skilled in the art will readily recognize that the equivalent of such software may also be constructed in hardware. Because arithmetic algorithms and systems are well known, the present description will be directed in particular to algorithms and systems forming part of, or cooperating more directly with, the method in accordance with the present invention. Other aspects of such algorithms and systems, together with hardware and software for producing and otherwise processing the image signals involved therewith, not specifically shown or described herein may be selected from such systems, algorithms, components, and elements known in the art. Given the system as described according to the invention in the following, software not specifically shown, suggested, or described herein that is useful for implementation of the invention is conventional and within the ordinary skill in such arts.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense.

Figure 2:
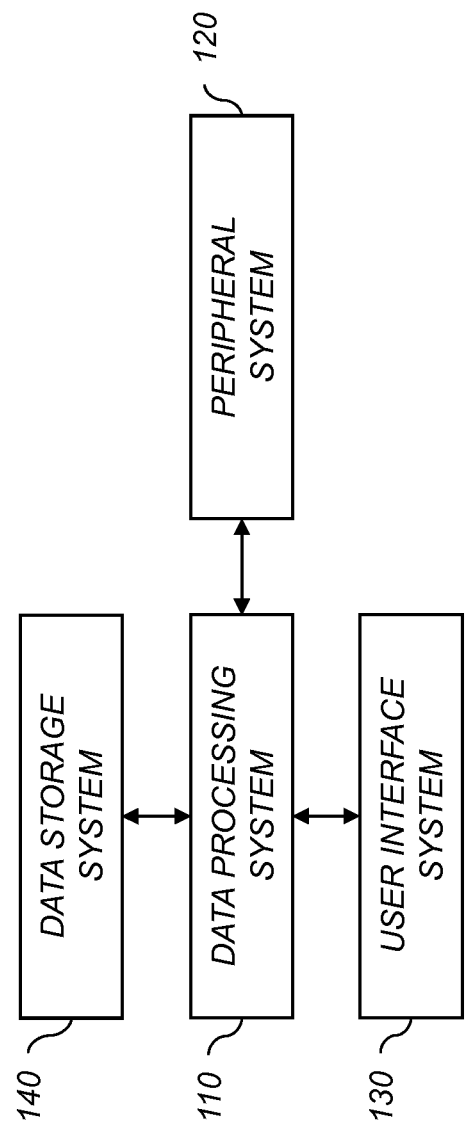
FIG. 2 is a high-level diagram showing the components of a system for flow according to an embodiment of the present invention.

FIG. 2 is a high-level diagram showing the components of a system for converting a first floating point number represented in a first floating point format to an equivalent second floating point number in a second floating point format according to an embodiment of the present invention. The system includes a data processing system 110, a peripheral system 120, a user interface system 130, and a data storage system 140. The peripheral system 120, the user interface system 130 and the data storage system 140 are communicatively connected to the data processing system 110.

The data processing system 110 includes one or more data processing devices that implement the processes of the various embodiments of the present invention, including the example processes described herein. The phrases "data processing device" or "data processor" are intended to include any data processing device, such as a central processing unit ("CPU"), a desktop computer, a laptop computer, a mainframe computer, a personal digital assistant, a Blackberry™, a digital camera, cellular phone, or any other device for processing data, managing data, or handling data, whether implemented with electrical, magnetic, optical, biological components, or otherwise.

The data storage system 140 includes one or more processor-accessible memories configured to store information, including the information needed to execute the processes of the various embodiments of the present invention, including the example processes described herein. The data storage system 140 may be a distributed processor-accessible memory system including multiple processor-accessible memories communicatively connected to the data processing system 110 via a plurality of computers or devices. On the other hand, the data storage system 140 need not be a distributed processor-accessible memory system and, consequently, may include one or more processor-accessible memories located within a single data processor or device.

The phrase "processor-accessible memory" is intended to include any processor-accessible data storage device, whether volatile or nonvolatile, electronic, magnetic, optical, or otherwise, including but not limited to, registers, floppy disks, hard disks, Compact Discs, DVDs, flash memories, ROMs, and RAMs.

The phrase "communicatively connected" is intended to include any type of connection, whether wired or wireless, between devices, data processors, or programs in which data may be communicated. The phrase "communicatively connected" is intended to include a connection between devices or programs within a single data processor, a connection between devices or programs located in different data processors, and a connection between devices not located in data processors at all. In this regard, although the data storage system 140 is shown separately from the data processing system 110, one skilled in the art will appreciate that the data storage system 140 may be stored completely or partially within the data processing system 110. Further in this regard, although the peripheral system 120 and the user interface system 130 are shown separately from the data processing system 110, one skilled in the art will appreciate that one or both of such systems may be stored completely or partially within the data processing system 110.

The peripheral system 120 may include one or more devices configured to provide digital content records to the data processing system 110. For example, the peripheral system 120 may include digital still cameras, digital video cameras, cellular phones, or other data processors. The data processing system 110, upon receipt of digital content records from a device in the peripheral system 120, may store such digital content records in the data storage system 140.

The user interface system 130 may include a mouse, a keyboard, another computer, or any device or combination of devices from which data is input to the data processing system 110. In this regard, although the peripheral system 120 is shown separately from the user interface system 130, the peripheral system 120 may be included as part of the user interface system 130.

The user interface system 130 also may include a display device, a processor-accessible memory, or any device or combination of devices to which data is output by the data processing system 110. In this regard, if the user interface system 130 includes a processor-accessible memory, such memory may be part of the data storage system 140 even though the user interface system 130 and the data storage system 140 are shown separately in FIG. 2.

The present invention is a new and more efficient way to convert numbers between different floating point formats having different base values. As discussed earlier, the prior art methods for converting between different floating point formats generally involve the use of a large bias LUT 55 (FIG. 1) to store the results of the bias calculations given in Eq. (6). During the process of implementing a floating point format conversion process, the inventor of the present invention produced a bias LUT 55 of this type and noticed some surprising and unexpected patterns that occurred in the bias values stored in the bias LUT 55. In particular, it was observed that for the case of converting from a binary floating point number to a decimal floating point number, that every value in the bias LUT was a power of two divided by a power of ten. An investigation of the source of these unexpected patterns led to the discovery of an unobvious and previously undiscovered relationship between the bias value 65 and the input exponent 25 ($E_1$) and the output exponent 50 ($E_2$). According to the method of the present invention, this useful relationship can be exploited to provide an improved method to convert between different floating point formats that requires significantly fewer computing resources.

A derivation of this useful relationship is now provided. Solving Eq. (2) for $M_2$ gives:

$$M_2 = M_1 \times \frac{B_1^{E_1}}{B_2^{E_2}} \quad (7)$$

where $B_1$ is the first base, $E_1$ is the first exponent and $M_1$ is the first significand for the first floating point format, and $B_2$ is the second base, $E_2$ is the second exponent, and $M_2$ is the second significand for the second floating point format. Substituting Eq. (7) into Eq. (5) gives:

$$M_1 \times \frac{B_1^{E_1}}{B_2^{E_2}} = M_1 \times B_2^{Rem[E_1 \times logB_1/logB_2,1]} \quad (8)$$

Cancelling $M_1$ from both sides of the equation and rearranging to solve for the bias value of Eq. (6) gives the result that:

$$\text{bias} = B_2^{Rem[E_1 \times logB_1/logB_2,1]} = \frac{B_1^{E_1}}{B_2^{E_2}} \quad (9)$$

A variation of this equation that is useful in some embodiments is given by rearranging the fraction on the right side:

$$\text{bias} = B_2^{Rem[E_1 \times logB_1/logB_2,1]} = \frac{B_1^{-E_1}}{B_1^{-E_1}} \quad (10)$$

Thus it can be seen from Eq. (9) and Eq. (10) that the complex expression for the bias given in Eq. (6) can be replaced by a ratio of two much simpler expressions. Using this expression, the bias value can be calculated without the need for any Taylor series approximations, and can therefore be determined with higher accuracy. Additionally, when either the first base $B_1$ or the second base $B_2$ is a power of two, the factor including the power of two base can conveniently be applied using a binary shift operation which is very computationally efficient.

For the important case of converting from a binary floating point number ($B_1$=2) to a decimal floating point number ($B_2$=10), Eq. (9) can be used to provide a bias value ($\text{bias}_{2 \to 10}$) of:

$$\text{bias}_{2 \to 10} = \frac{2^{E_1}}{10^{E_2}} = 10^{-E_2} \times 2^{E_1} \quad (11)$$

Likewise, for the reverse case of converting from a decimal floating point number ($B_1$=10) to a binary floating point number ($B_2$=2), Eq. (10) can be used to provide a bias value ($\text{bias}_{10 \to 2}$) of:

$$\text{bias}_{10 \to 2} = \frac{2^{-E_2}}{10^{-E_1}} = 10^{E_1} \times 2^{-E_2} \quad (12)$$

In both Eqs. (11) and (12) it can be seen that the bias values include two factors: a first factor which is a power of ten, and a second factor which is a power of two. The power of ten factor can be calculated in a variety of ways. In one embodiment, the power of ten factor is determined by computing a "tens LUT" which stores the result of the exponentiation calculation for every possible value of the exponent. It should be noted from Tables 1 and 2 that since the range of exponents for the decimal floating point format is substantially larger than the range of exponents for the corresponding binary floating point format, the number of entries in the tens LUT will be significantly smaller than the number of entries in the bias LUT 55 of FIG. 1. The power of two factor in Eqs. (11)

and (12) can conveniently be applied by applying a binary shift operation to the value obtained from the tens LUT. Thus highly precise bias values can be calculated using a look-up operation, followed by a binary shift operation. Both of these operations are highly efficient for computation using either software or hardware implementations.

Figure 3:
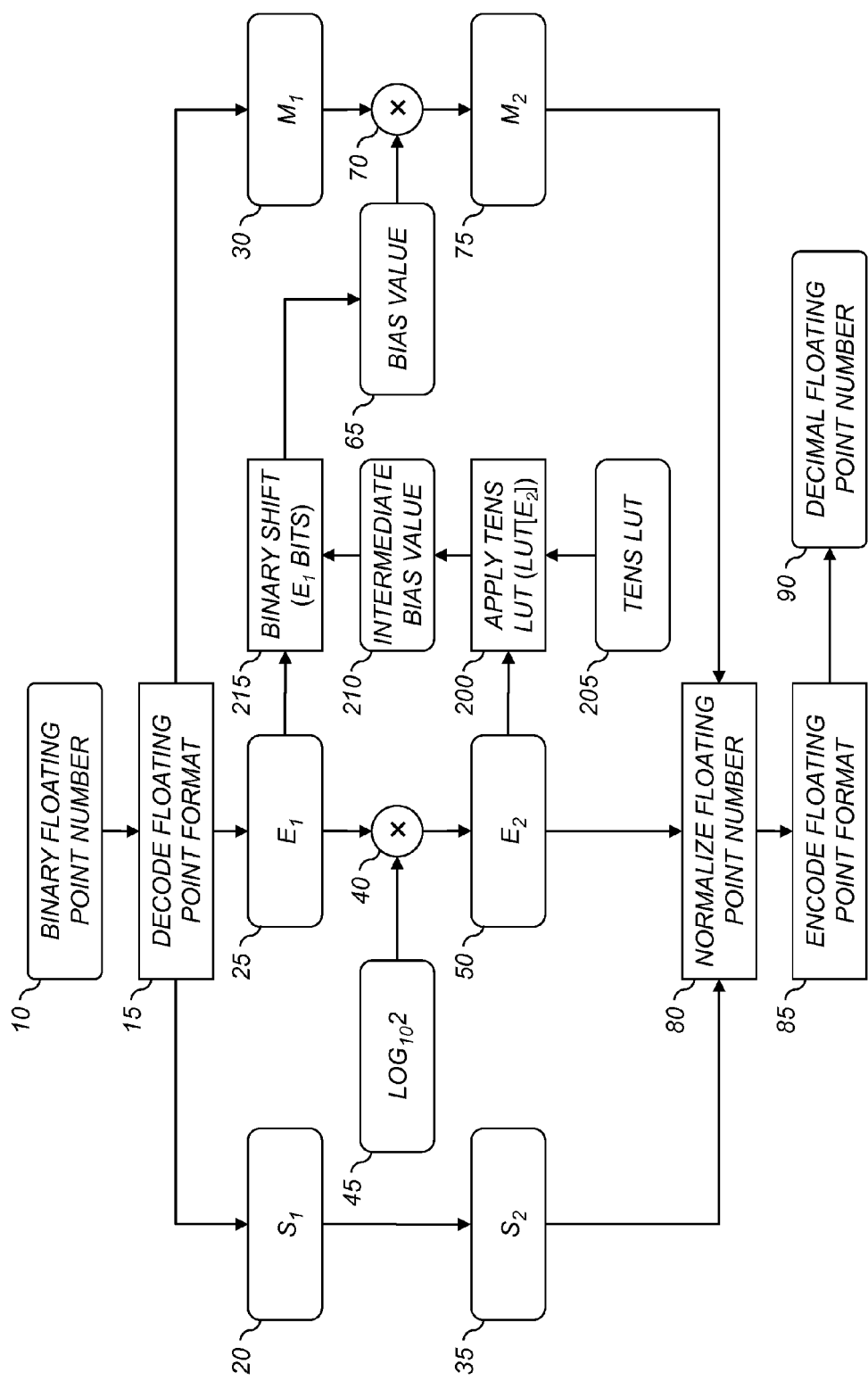
FIG. 3 is a flow chart for a method of converting from a binary floating point format to a decimal floating point format in accordance with one embodiment of the present invention.

FIG. 3 shows a flow chart of a method for converting from a binary floating point number 10 having an input base $B_1=2$ to a decimal floating point number 90 having an output base $B_2=10$ according to an embodiment of the present invention. Where elements of this embodiment are common with the prior art configuration of FIG. 1, common part numbers have been used.

Figure 1:
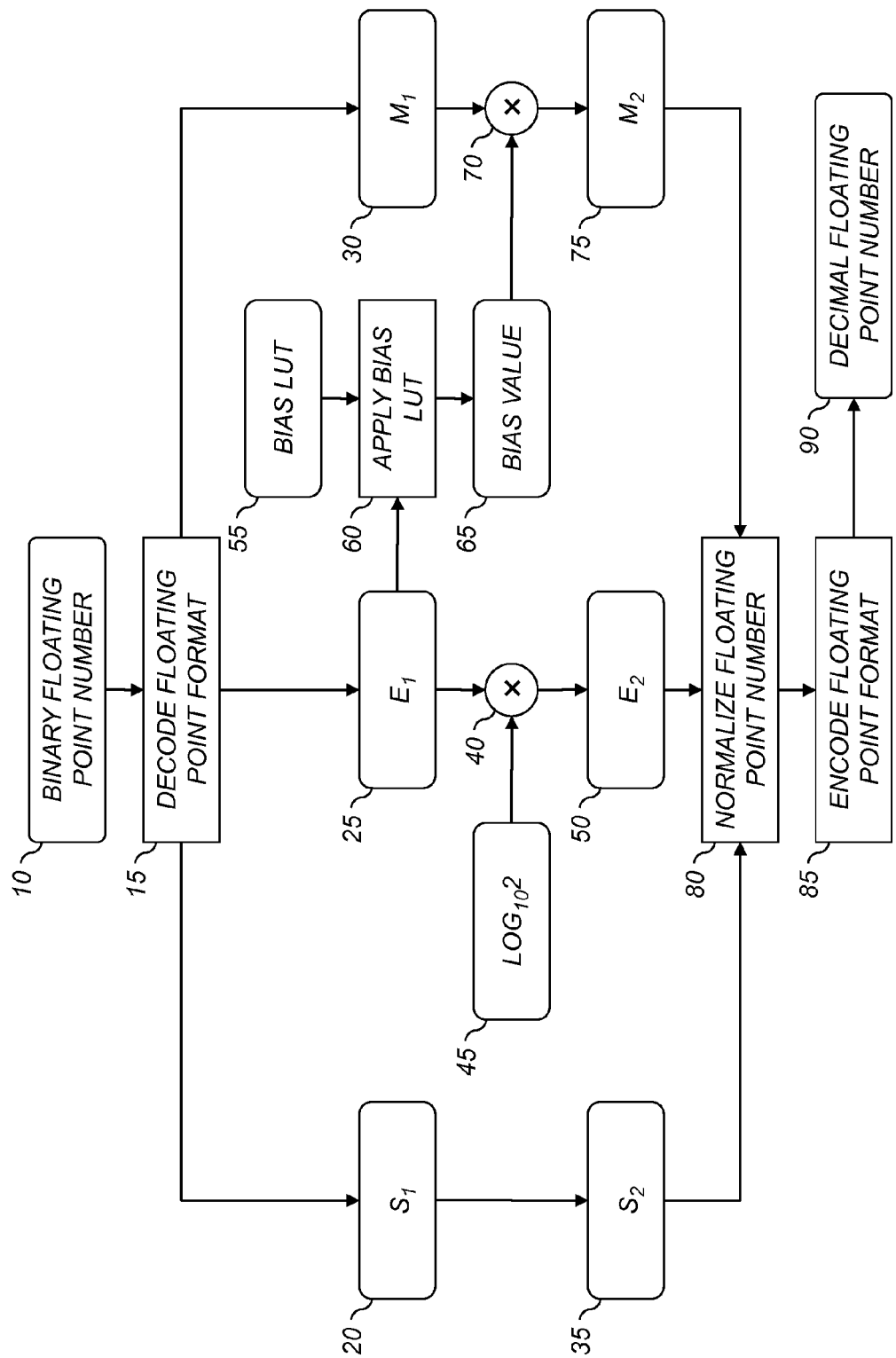
FIG. 1 is a flow chart for a prior art method of converting from a binary floating point format to a decimal floating point format.

As described with respect to FIG. 1, the decode floating point format step 15 is used to decode the binary floating point number 10 to extract the corresponding input sign value 20 ($S_1$), the input exponent 25 ($E_1$), and the input significand 30 ($M_1$). The output sign value 35 ($S_2$) is simply set to be equal to the input sign value 20 ($S_1$). According to Eq. (4), the input exponent 25, is multiplied by a predetermined constant 45 using a multiplier 40 to compute the output exponent 50 ($E_2$). The value of the predetermined constant 45 is substantially equal to log 2/log 10=$\log_{10} 2$. In the context of the present invention, the term "substantially equal" should be interpreted to mean that the value is calculated and stored using a digital representation having some specified precision. The value of the constant is therefore equal to the desired result to within the precision limitations of the digital representation. The multiplier 40 includes the application of an Int[.] operator so that the resulting output exponent 50 ($E_2$) is an integer. In equation form, this is given by:

$$E_2 = \text{Int}[E_1 \times \log_{10} 2] = \text{Int}\left[E_1 \times \frac{\log 2}{\log 10}\right] \quad (13)$$

where the appropriate base values have been substituted into Eq. (4)

An apply tens LUT step 200 is used to determine an intermediate bias value 210 by addressing a tens LUT 205 using the output exponent 50 ($E_2$). In one embodiment, the tens LUT 205 (bias$_t$[$E_2$]) stores the result of the calculation:

$$bias_t[E_2] = \frac{1}{10^{E_2}} = 10^{-E_2} \quad (14)$$

for every possible value of the output exponent 50 ($E_2$). The values stored in the tens LUT 205 range from $10^{-E_{min}}$ to $10^{-E_{max}}$, where the values of $E_{min}$ and $E_{max}$ for common decimal floating point formats are given in Table 2. Because the range of values is very large, the values stored in the tens LUT 205 are preferably stored as a fixed point number, together with a shift value indicating the number of bits that the fixed point number should be shifted to provide the desired result.

It should be noted that if the tens LUT 205 is designed to use with a particular floating point precision level (e.g., for converting from binary128 to decimal128), it can also be used for converting between all other defined formats having lower precision levels (e.g., for converting from binary64 to decimal64). Therefore, it will generally be desirable to build the tens LUT 205 for the highest precision level of interest, and it can then also be used to convert floating point numbers having a lower precision.

A binary shift step 215 is used to apply a binary shift operation to the intermediate bias value 210 to determine the bias value 65. The binary shift step 215 effectively multiplies the intermediate bias value 210 by the factor $2^{E_1}$ by shifting the bits by $E_1$ bit positions. For example, if $E_1=3$, then the intermediate bias value 210 can be multiplied by $2^3$ by shifting the bits of the intermediate bias value 210 by 3 bit positions. For the case where the values stored in the tens LUT 205 are stored as a fixed point number, together with a shift value indicating the number of bits that the fixed point number should be shifted, the binary shift step 215 can simultaneously apply both binary shift operations. The binary shift step 215 is typically implemented using a shift register.

Once the bias value 65 has been calculated, the rest of the steps are equivalent to those in FIG. 1. The input significand 30 ($M_1$) is multiplied by the bias value 65 using the multiplier 70 to compute the output significand 75 ($M_2$). The normalize floating point number step 80 is then used to normalize the components of the output floating point number according to the requirements of the specific output floating point format, and the encode floating point format step 85 encodes the output sign value 35 ($S_2$), the output exponent 50 ($E_2$) and the output significand 75 ($M_2$) according to the specification for desired decimal floating point format (e.g., according to the IEEE 754-2008 standard) to produce the decimal floating point number 85.

The size of the memory that must be set aside for storing the tens LUT 205 in the FIG. 3 embodiment is significantly less than that required to store the bias LUT 55 in the prior art FIG. 1 implementation. Consider the case where the binary floating point format for the binary floating point number 10 is the "binary64" format, and the decimal floating point format for the decimal floating point number 90 is the "decimal64" format, both formats being described in IEEE 754-2008. In this example, the bias LUT 55 of FIG. 1 would need to store 2046 different entries, whereas the tens LUT 205 of FIG. 3 would only need to store 768 different values, thus providing a substantial reduction in the required storage memory.

Figure 4:
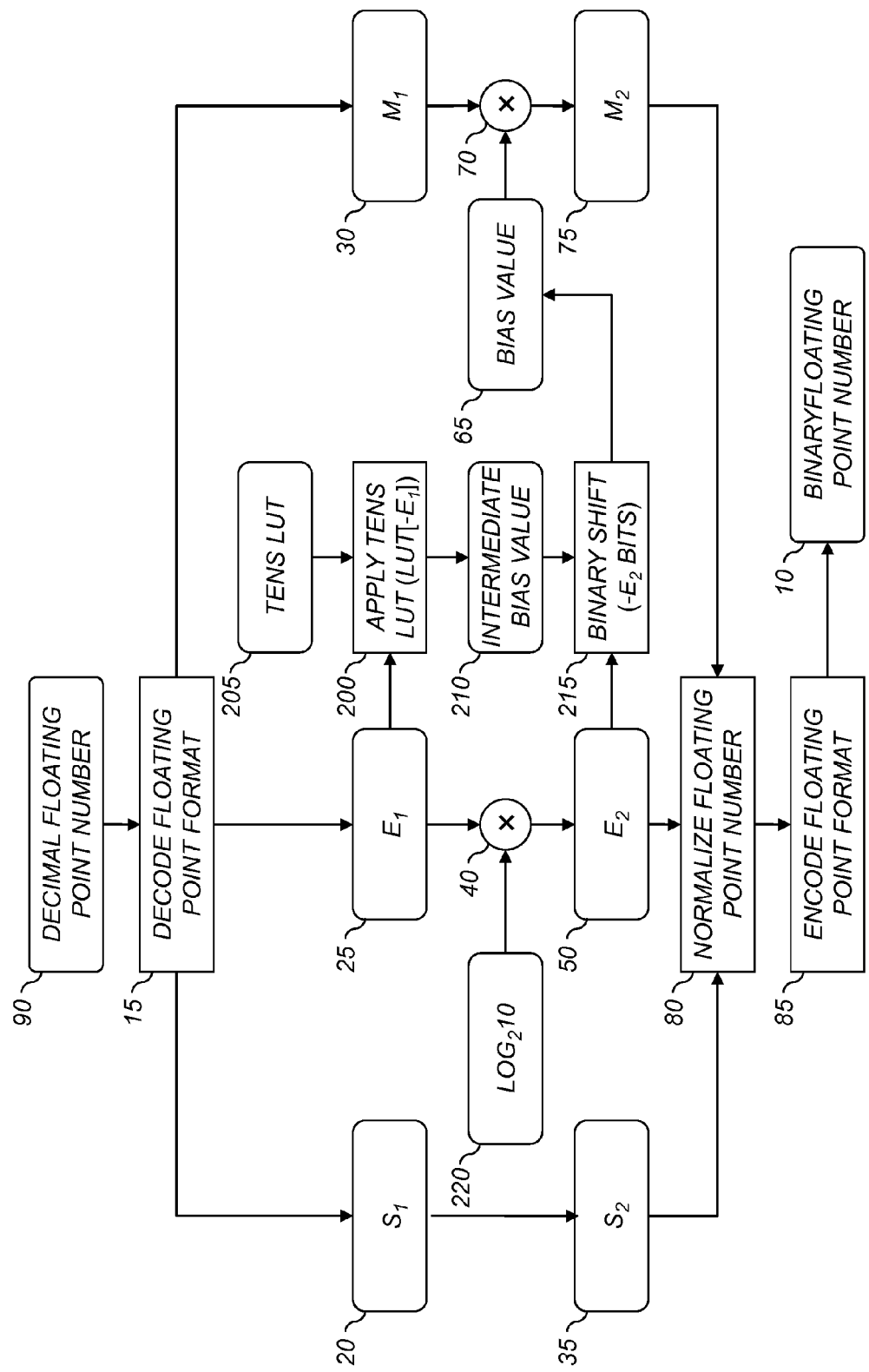
FIG. 4 is a flow chart for a method of converting from a decimal floating point format to a binary floating point format in accordance with one embodiment of the present invention.

FIG. 4 shows a flow chart of an analogous method for converting from a decimal floating point number 90 having an input base $B_1=10$ to a binary floating point number 10 having an output base $B_2=2$ according to an embodiment of the present invention. It can be seen that many of the elements of this configuration are identical to the method shown in FIG. 3. In this case, the input exponent 25, is multiplied by a different predetermined constant 220 (log 10/log 2=$\log_2 10$) to compute the output exponent 50 ($E_2$). In equation form:

$$E_2 = \text{Int}[E_1 \times \log_2 10] = \text{Int}\left[E_1 \times \frac{\log 10}{\log 2}\right] \quad (15)$$

In this case, the apply tens LUT step 200 is used to determine an intermediate bias value 210 by addressing a tens LUT 205 with the negative of the input exponent 25 (−$E_1$) rather than the output exponent 50 as in FIG. 4. The resulting intermediate bias values will therefore have the value of $10^{E_1'}$.

The binary shift step 215 is used to apply a binary shift operation to the intermediate bias value 210 to determine the bias value 65. In this case, the binary shift step 215 effectively multiplies the intermediate bias value 210 by the factor $2^{-E_2}$. For example, if $E_2=3$, then the intermediate bias value 210 can be multiplied by $2^{-3}$ by shifting the bits of the intermediate bias value 210 by 3 bit locations. For the case where the values stored in the tens LUT 205 are stored as a fixed point number, together with a shift value indicating the number of bits that the fixed point number should be shifted, the binary shift step 215 can simultaneously apply both binary shift operations.

An attractive feature of the configurations shown in FIGS. 3 and 4 is that the same tens LUT 205 is used in both cases. Therefore, no additional LUT storage memory is required to convert between binary floating point numbers and decimal floating point numbers in both the forward and reverse directions. This is a significant advantage over the prior art configuration shown in FIG. 1, where different bias LUTs 55 would be required for the forward and reverse conversions.

Once the bias value 65 has been calculated, the rest of the steps are equivalent to those in FIG. 3, except that the normalize floating point number step 80 and the encode floating point format step 85 are performed according to the specification for desired binary floating point format (e.g., according to the IEEE 754-2008 standard) to produce the binary floating point number 10.

As discussed earlier, the normalize floating point number step 80 typically involves scaling the output significand 75 ($M_2$) by factors of the output base $B_2$. For the case where the output floating point number has a base $B_2=2$, this scaling can be done using a binary shift operation. In some embodiments, the binary shift step 215 can be combined with the binary shift applied in the normalize floating point number step 80 to reduce the computation time.

Figure 5:
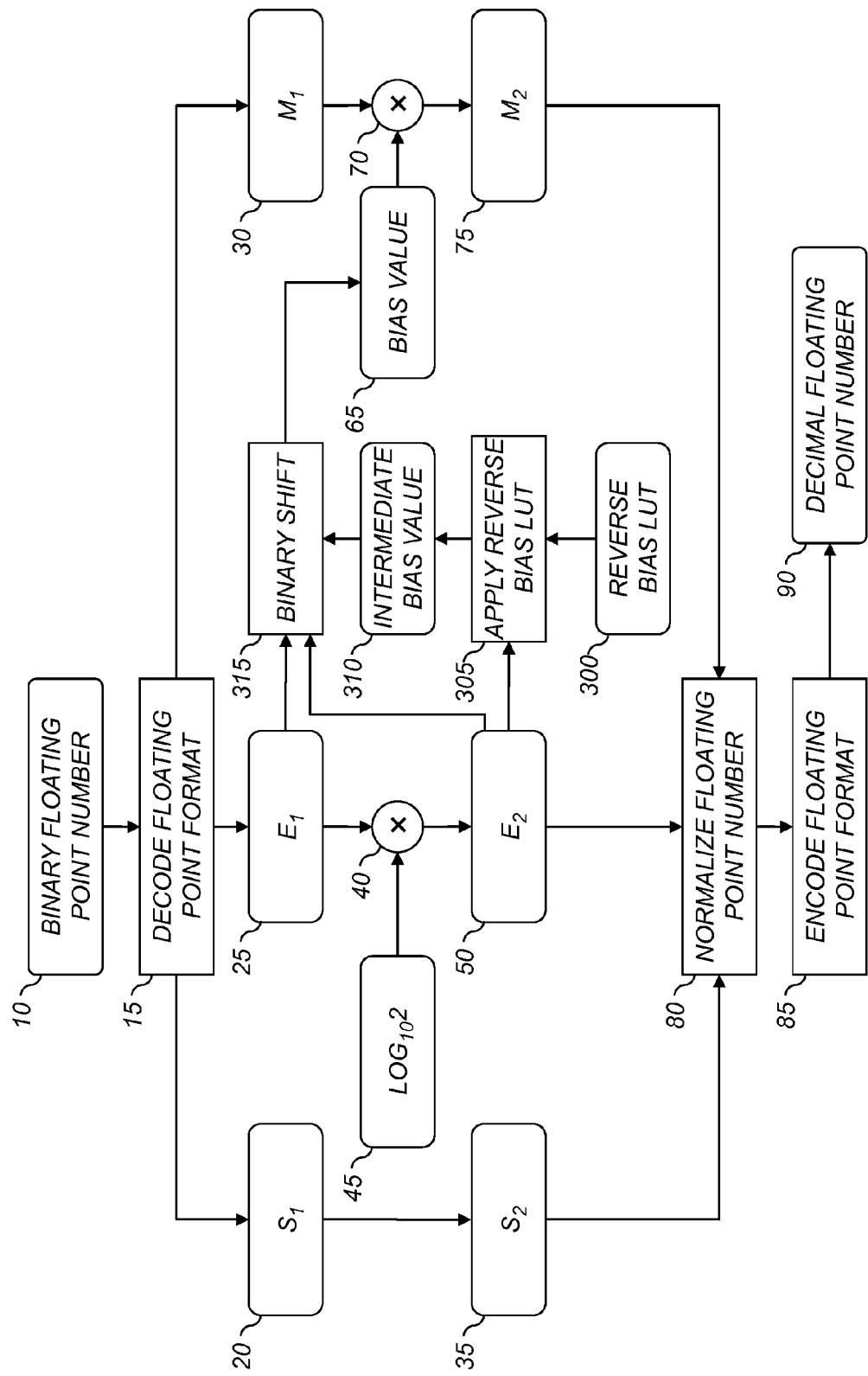
FIG. 5 is a flow chart for a method of converting from a binary floating point format to a decimal floating point format in accordance with a second embodiment of the present invention.

As noted earlier, the range of values that are stored in the tens LUT 205 according to the embodiments of FIGS. 3 and 4 is quite large. While this problem can be addressed by storing the values in the tens LUT 205 as fixed point numbers, together with corresponding shift values indicating the number of bits that the fixed point number should be shifted, this adds complexity to the implementation and requires allocation of additional memory to store the shift values. FIG. 5 is a flow chart showing an alternate embodiment which overcomes these limitations. In this case, an apply reverse bias LUT step 305 is used to determine an intermediate bias value 310 by addressing a reverse bias LUT 300 using the output exponent 50 ($E_2$).

The reverse bias LUT 300 stores the values of the following expression for every possible value of the output exponent 50 ($E_2$):

$$\text{bias}_i[E_2] = \frac{2^{E_1'}}{10^{E_2}} = \frac{2^{\text{Int}[E_2 \log_2 10]}}{10^{E_2}} \quad (16)$$

where:

$$E_1' = \text{Int}[E_2 \log_2 10] \quad (17)$$

The reverse bias LUT 300 can be shown to exactly correspond to the bias LUT that would be used according to the configuration of FIG. 1 for performing the reverse conversion from the decimal floating point number 90 to the binary floating point number 10 (hence, the "reverse" designation), except that the reverse bias LUT 300 would need to be addressed with $-E_1$.

It can be seen that the intermediate bias value 310 given by Eq. (16) is approximately the same as the desired bias value given by Eq. (11) except that $E_1'$ is only an approximation for the input exponent 25 ($E_1$). This is due to the fact that the multiplier 40 will map several different $E_1$ values to the same $E_2$ value. For example, $E_1$ values of 7, 8 and 9 will all map to an $E_2$ value of 2. As a result, the intermediate bias value can be off by a factor of two given by $2^1=2\times$, $2^2=4\times$ or $2^3=8\times$ relative to the desired bias value given by Eq. (11). The binary shift step 315 is used to correct for this factor of two. In particular, the binary shift step 315 applies a binary shift operation to the intermediate bias value 310, where the magnitude of the shift $\Delta E_1$ is given by:

$$\Delta E_1 = E_1 - E_1' = E_1 - \text{Int}[E_2 \log_2 10] \quad (18)$$

An advantage of the configuration of FIG. 5 is that the same reverse bias LUT 300 can be used for both the forward and reverse conversions. This greatly reduces the memory requirements relative to the prior art configuration of FIG. 1. Consider the case where binary floating point number 10 is the "binary64" format, and the decimal floating point format for the decimal floating point number 90 is the "decimal64" format, both formats being described in IEEE 754-2008. If both the forward and reverse conversions are implemented using the FIG. 1 configuration, the bias LUT 55 for the forward conversion would need to store 2,046 entries, each of which requires 53 bits, and the bias LUT 55 for the reverse conversion would need to store 768 entries, each of which requires 50 bits. The total memory required to store the two bias LUTs 55 would be about 17.9 Kbytes. On the other hand, if the method of FIG. 5 is used to implement the forward conversion from the binary floating point format to the decimal floating point format, and the method of FIG. 1 is used to implement the reverse conversion, only the single reverse bias LUT 300 needs to be stored. In this case, the reverse bias LUT 300 needs to store 768 entries, each of which requires 53 bits, for a total of about 5.0 Kbytes. This is a savings of approximately 72% in the amount of storage memory.

As with the tens LUT 205, it should be noted that if the reverse bias LUT 300 is designed to use with a particular floating point precision level (e.g., for converting from binary128 to decimal128), it can also be used for converting between all other defined formats having lower precision levels (e.g., for converting from binary64 to decimal64). Therefore, it will generally be desirable to build the reverse bias LUT 300 for the highest precision level of interest, and it can then also be used to convert floating point numbers having a lower precision.

The embodiments of the present invention described relative to FIGS. 3-5 all involve converting between binary floating point numbers 10 and decimal floating point numbers 90. It will be obvious to one of ordinary skill in the art that the method of the present invention can easily be adapted to work with floating point numbers having other bases as well. Notably, the same advantages can be achieved if the binary floating point number 10 is replaced with a floating point number having a base that is an integer power of two, and the decimal floating point number 90 is replaced with a floating point number having any arbitrary base that is not an integer power of two. Consider the case where the binary floating point number 10 of FIG. 3 is replaced with a floating point number having a base that is a different integer power of two (e.g., $B=2^2=4$, $B=2^3=8$ or $B=2^4=16$). In order to properly account for different base, the magnitude of the shift applied by the binary shift step 215 needs to be adjusted accordingly. For example, if the input floating point number has a base of $B_1=4$, then the binary shift step 215 can be used to multiply the intermediate bias value 210 by the factor $4^{E_1}=2^{2E_1}$ by shifting the bits of the intermediate bias value 210 by $2\times E_1$ bit positions. Likewise, the value of the constant 45 and the contents of the tens LUT 205 will also need to be adjusted accordingly by substituting the new base values into the corresponding equations. For example, if the decimal floating point number 90 is replaced with a floating point number having a base of nine then tens LUT 205 would need to be replaced with a "nines LUT" where the "10" in Eq. (14) is replaced with a "9." Analogous changes can also be made to use different bases with the embodiments of FIGS. 4 and 5 as well.

Embodiments of the present invention can be implemented in a variety of ways. In some embodiments, the methods can be implemented as software packages that can be executed by host computers. In other embodiments, the methods can be implemented in various hardware configurations. Most computers include a hardware Floating-Point Unit (FPU) which performs calculations with floating point numbers. In current systems, the FPU is generally incorporated within a Central Processing Unit (CPU) or a microprocessor. However, in some configurations, the FPU can be an independent processor. Most FPUs today are based on binary floating point numbers. However, in the future it is expected that many FPUs will use decimal floating point numbers. Therefore, conversion between binary and decimal floating point formats will be an increasingly important function that must be included in FPU designs.

To design an FPU, chip designers generally write Register Transfer Language (RTL) code. (There are a number of different RTL languages that can be used including VHDL and Verilog.) The RTL code can then be synthesized into a hardware design. In the hardware design, the various calculations and look-up tables are implements using arrangements of logic gates. The number of logic gates will have a direct effect on the final cost of the design. Therefore, there is a significant benefit to reducing the amount of look-up table memory required in a FPU design. As noted above, the method of the present invention can reduce the amount of look-up table memory by about 72% relative to the current approaches. The use of the floating point conversion methods described above will therefore have the result of significantly reducing the number of logic gates that are required to implement the FPU, and will produce a substantial cost savings.

A computer program product can include one or more non-transitory, tangible, computer readable storage medium, for example; magnetic storage media such as magnetic disk (such as a floppy disk) or magnetic tape; optical storage media such as optical disk, optical tape, or machine readable bar code; solid-state electronic storage devices such as random access memory (RAM), or read-only memory (ROM); or any other physical device or media employed to store a computer program having instructions for controlling one or more computers to practice the method according to the present invention.

The invention has been described in detail with particular reference to certain preferred embodiments thereof, but it will be understood that variations and modifications can be effected within the spirit and scope of the invention.

PARTS LIST 10 binary floating point number
15 decode floating point format step
20 input sign value
25 input exponent
30 input significand
35 output sign value
40 multiplier
45 constant
50 output exponent
55 bias LUT
60 apply bias LUT step
65 bias value
70 multiplier
75 output significand
80 normalize floating point number step
85 encode floating point format step
90 decimal floating point number
110 data processing system
120 peripheral systems
130 user interface system
140 data storage system
200 apply tens LUT step
205 tens LUT
210 intermediate bias value
215 binary shift step
220 constant
300 reverse bias LUT
305 apply reverse bias LUT step
310 intermediate bias value
315 binary shift step

The invention claimed is:

1. A computer program product for converting a first floating point number represented in a first floating point format to an equivalent second floating point number in a second floating point format, the first floating point format having an associated first base value and being represented by a first significand value and a first exponent value, and the second floating point format having an associated second base value different from the first base value and being represented by a second significand value and a second exponent value, wherein either the first base value or the second base value is an integer power of two, and the other base value is not an integer power of two, comprising a non-transitory tangible computer readable storage medium storing an executable algorithm for causing a data processing system to perform the steps of:

determining the second exponent value for the second floating point number by multiplying the first exponent value by a predefined constant and taking the integer portion of the result, the predefined constant being substantially equivalent to the logarithm of the first base value divided by the logarithm of the second base value;

determining a bias value that is substantially equivalent to the first base value raised to the first exponent value divided by the second base value raised to the second exponent value wherein the determination of the bias value includes:

determining an intermediate bias value by addressing a look-up table with the exponent value corresponding to the base that is not an integer power of two; and determining the bias value by applying a binary shift operation to the intermediate bias value, wherein a magnitude of the binary shift is determined responsive to the exponent value corresponding to the base that is an integer power of two; and determining the second significand value for the second floating point number by multiplying the first significand value by the bias value.

2. The computer program product of claim 1 wherein the binary shift operation is applied using a shift register.

3. The computer program product of claim 1 wherein the first floating point format is a binary floating point format having a first base value of two and the second floating point format is a decimal floating point format having a second base value of ten.

4. The computer program product of claim 3 wherein the binary floating point format is an IEEE 754-2008 binary floating point format and the decimal floating point format is an IEEE 754-2008 decimal floating point format.

5. The computer program product of claim 1 wherein the first floating point format is a decimal floating point format having a first base value of ten and the second floating point format is a binary floating point format having a second base value of two.

6. The computer program product of claim 5 wherein the binary floating point format is an IEEE 754-2008 binary floating point format and the decimal floating point format is an IEEE 754-2008 decimal floating point format.

7. The computer program product of claim 1 wherein the first floating point format further includes a first sign value and the second floating point format further includes a second sign value, and wherein the second sign value is set to be equal to the first sign value.

8. The computer program product of claim 1 further including performing a normalization process to the second floating point number, where the normalization process includes:

multiplying or dividing the second significand value by a scale value equal to the second base value raised to an integer power to provide a modified second significand value, wherein the modified second significand value falls within a specified range; and decrementing or incrementing the second exponent value by a corresponding value equal to the integer power to provide a modified second exponent value.

9. The computer program product of claim 1 wherein the first floating point format has an associated first binary encoding including a first set of exponent bits representing the first exponent value and a first set of significand bits representing the first significand value, and further including determining the first exponent value and the first significand value by decoding the first set of exponent bits and the first set of significand bits, respectively.

10. The computer program product of claim 1 wherein the second floating point format has an associated second binary encoding including a second set of exponent bits representing the second exponent value and a second set of significand bits representing the second significand value, and further including performing an encoding process to determine the second set of significand bits and the second set of exponent bits needed to represent the second significand value and the second exponent value, respectively.

11. The computer program product of claim 1 wherein the base value that is an integer power of two is equal to two so that the corresponding floating point number is a binary floating point number, wherein the base value that is not an integer power of two is equal to ten so that the corresponding floating point number is a decimal floating point number.

12. The computer program product of claim 1 wherein the non-transitory tangible computer readable storage medium is a component of a hardware floating-point unit.

13. A computer program product for converting a binary floating point number represented in a binary floating point format to an equivalent decimal floating point number in a decimal floating point format, the binary floating point format having an associated first base value of two and being represented by a first significand value and a first exponent value, and the decimal floating point format having an associated second base value of ten and being represented by a second significand value and a second exponent value, comprising a non-transitory tangible computer readable storage medium storing an executable algorithm for causing a data processing system to perform the steps of:

determining the second exponent value for the decimal floating point number by multiplying the first exponent value by a predefined constant and taking the integer portion of the result, the predefined constant being substantially equivalent to the logarithm of two divided by the logarithm of ten;

determining a bias value that is substantially equivalent to two raised to the first exponent value divided by ten raised to the second exponent value, wherein the determination of the bias value includes:

determining an intermediate bias value by addressing a look-up table with the second exponent value; and determining the bias value by applying a binary shift operation to the intermediate bias value, wherein a magnitude of the binary shift is determined responsive to the first exponent value; and determining the second significand value for the second floating point number by multiplying the first significand value by the bias value.

14. The computer program product of claim 13 wherein the look-up table stores representations of the intermediate bias values for a range of different possible second exponent values, and wherein the intermediate bias values are determined by:

$$\text{bias}_i[E_2] = 10^{-E_2}$$

where $E_2$ is the second exponent value and $bias_i[E_2]$ is the intermediate bias value.

15. The computer program product of claim 13 wherein the magnitude of the binary shift includes a term equal to the first exponent value.

16. The computer program product of claim 13 wherein the stored representations of the intermediate bias values includes a fixed point number and a shift value, and wherein the magnitude of the binary shift includes a term equal to the shift value.

17. The computer program product of claim 13 wherein the determination of the magnitude of the binary shift is also responsive to the second exponent value.

18. The computer program product of claim 17 wherein the determination of the magnitude of the binary shift is given by:

$$\Delta E_1 = E_1 - \text{Int}[E_2 \log_2 10]$$

where $E_1$ is the first exponent value, $E_2$ is the second exponent value, and $\Delta E_1$ is the magnitude of the binary shift.

19. The computer program product of claim 13 wherein the look-up table stores representations of the intermediate bias values for a range of different possible second exponent values, and wherein the intermediate bias values are determined by:

$$bias_i[E_2] = \frac{2^{Int[E_2 \log_2 10]}}{10^{E_2}}$$

where $E_2$ is the second exponent value and $bias_i[E_2]$ is the intermediate bias value.

20. The computer program product of claim 13 wherein the non-transitory tangible computer readable storage medium is a component of a hardware floating-point unit.

21. A floating-point unit including a floating point format converter for converting a binary floating point number represented in a binary floating point format to an equivalent decimal floating point number in a decimal floating point format, the binary floating point format having an associated first base value of two and being represented by a first significand value and a first exponent value, and the decimal floating point format having an associated second base value of ten and being represented by a second significand value and a second exponent value, comprising:
  a multiplier for determining the second exponent value for the decimal floating point number by multiplying the first exponent value by a predefined constant and taking the integer portion of the result, the predefined constant being substantially equivalent to the logarithm of two divided by the logarithm of ten;
  a look-up table unit for determining an intermediate bias value by addressing an intermediate bias look-up table with the second exponent value;
  a shift register for determining a bias value by applying a binary shift operation to the intermediate bias value, the magnitude of the binary shift being determined responsive to the first exponent value, wherein the determined bias value is substantially equivalent to two raised to the first exponent value divided by ten raised to the second exponent value; and
  a multiplier for determining the second significand value for the second floating point number by multiplying the first significand value by the bias value.

22. The floating-point unit of claim 21 further including a normalization unit for applying a normalization process to the second floating point number, where the normalization process includes:
  a multiplier or divider for multiplying or dividing the second significand value by a scale value equal to the second base value raised to an integer power to provide a modified second significand value, wherein the modified second significand value falls within a specified range; and
  a signed adder for decrementing or incrementing the second exponent value by a corresponding value equal to the integer power to provide a modified second exponent value.

23. The floating-point unit of claim 21 wherein the first floating point format has an associated first binary encoding including a set of first exponent bits representing the first exponent value and a first set of significand bits representing the first significand value, and further including a decoding unit for applying a decoding process to determine the first exponent value and the first significand value by decoding the first set of exponent bits and the first set of significand bits, respectively.

24. The floating-point unit of claim 21 wherein the second floating point format has an associated second binary encoding including a second set of exponent bits representing the second exponent value and a second set of significand bits representing the second significand value, and further including an encoding unit for applying an encoding process to determine the second set of significand bits and the second set of exponent bits needed to represent the second significand value and the second exponent value, respectively.

25. The floating-point unit of claim 21 further including a reverse floating point format converter for converting a decimal floating point number represented in the decimal floating point format to an equivalent binary floating point number in the binary floating point format, wherein the reverse floating point format converter includes a look-up table unit for determining a bias value by addressing the intermediate bias look-up table associated with the floating point format converter using a negative of the exponent value for the decimal floating point number.

* * * * *